(12) United States Patent
Kuah et al.

(10) Patent No.: US 7,642,638 B2
(45) Date of Patent: Jan. 5, 2010

(54) INVERTED LEAD FRAME IN SUBSTRATE

(75) Inventors: Hsian Pang Kuah, Singapore (SG); Jenny Phua, Singapore (SG)

(73) Assignee: United Test And Assembly Center Ltd., Singapore (SG)

( * ) Notice: Subject to any disclaimer, the term of this patent is extended or adjusted under 35 U.S.C. 154(b) by 188 days.

(21) Appl. No.: 11/959,519

(22) Filed: Dec. 19, 2007

(65) Prior Publication Data

US 2008/0150106 A1 Jun. 26, 2008

Related U.S. Application Data

(60) Provisional application No. 60/871,509, filed on Dec. 22, 2006.

(51) Int. Cl.
| | |
|---|---|
| H01L 23/02 | (2006.01) |
| H01L 23/34 | (2006.01) |
| H01L 23/10 | (2006.01) |
| H01L 23/52 | (2006.01) |
| H01L 23/48 | (2006.01) |
| H01L 29/40 | (2006.01) |
| H01L 21/50 | (2006.01) |
| H01L 21/48 | (2006.01) |
| H01L 21/44 | (2006.01) |

(52) U.S. Cl. .................. 257/686; 257/723; 257/777; 257/706; 257/707; 438/109; 438/123

(58) Field of Classification Search .............. 257/686, 257/723, 777, 706, 707; 438/109, 123
See application file for complete search history.

(56) References Cited

U.S. PATENT DOCUMENTS

| | | | |
|---|---|---|---|
| 5,543,658 A | 8/1996 | Hosokawa et al. | |
| 5,633,528 A | 5/1997 | Abbott et al. | |
| 6,313,520 B1 | 11/2001 | Yoshida et al. | |
| 6,627,990 B1 * | 9/2003 | Shim et al. | 257/712 |
| 6,784,525 B2 | 8/2004 | Kuan et al. | |
| 6,825,549 B2 | 11/2004 | Grundler | |
| 6,831,352 B1 | 12/2004 | Tsai | |
| 7,119,424 B2 | 10/2006 | Ochiai et al. | |
| 7,205,651 B2 * | 4/2007 | Do et al. | 257/706 |
| 7,247,934 B2 * | 7/2007 | Pu | 257/686 |
| 7,479,407 B2 * | 1/2009 | Gehman et al. | 438/109 |
| 2002/0125550 A1 | 9/2002 | Estacio | |
| 2006/0220188 A1 | 10/2006 | Liu et al. | |

\* cited by examiner

*Primary Examiner*—Luan C Thai
(74) *Attorney, Agent, or Firm*—Sughrue Mion, PLLC (57) ABSTRACT

A semiconductor package, and method of making a semiconductor package, with a plurality of dies, wherein one die is attached to an inverted lead frame and another die is attached to a substrate. The leadframe is then attached to the substrate. More specifically, the semiconductor package includes a substrate, a lead frame and a plurality of leads. The lead frame is attached to the top surface of the substrate. The bottom surface of a first die is attached to the top surface of the substrate and the first die is electrically connected to the substrate. The top surface of a second die is attached to the bottom die pad surface of the lead frame and the second die is electrically connected to the leadframe. An encapsulant covers at least a portion of the lead frame and substrate.

26 Claims, 8 Drawing Sheets

INVERTED LEAD FRAME IN SUBSTRATE

CROSS REFERENCES TO RELATED APPLICATIONS

This Application claims benefit of co-pending U.S. Provisional Application No. 60/871,509, filed on Dec. 22, 2006, which are incorporated herein by reference.

FIELD OF THE INVENTION

The present invention relates to a semiconductor package, and method of making a semiconductor package, with a plurality of dies, wherein one die is attached to an inverted lead frame and another die is attached to a substrate. The leadframe is then attached to the substrate.

DESCRIPTION OF THE RELATED ART

Based on current packaging trends, a stacked die package typically includes a plurality of dies packaged in a vertical stack. Conventional methods of assembling the stacked die package involves seating a smaller die on top of a larger die to create a pyramid structure such that each die does not seat on the periphery of the die immediately below it where wire bonds are placed.

A problem would arise when a smaller die such as a radio frequency (RF) die is bundled with a larger die such as an application specific integrated circuit (ASIC) die using conventional die stacking methods, and the smaller die has conductor/resistance limitations. In such packages, it is preferable that the wire bond connecting the RF die to a substrate be kept as short as possible. Conventional methods of die stacking, however, requires the smaller RF die to be stacked on top of the larger ASIC die. Therefore, the RF die being further away from the substrate relative to the ASIC die, would have a longer wire bond.

Figure 10A:
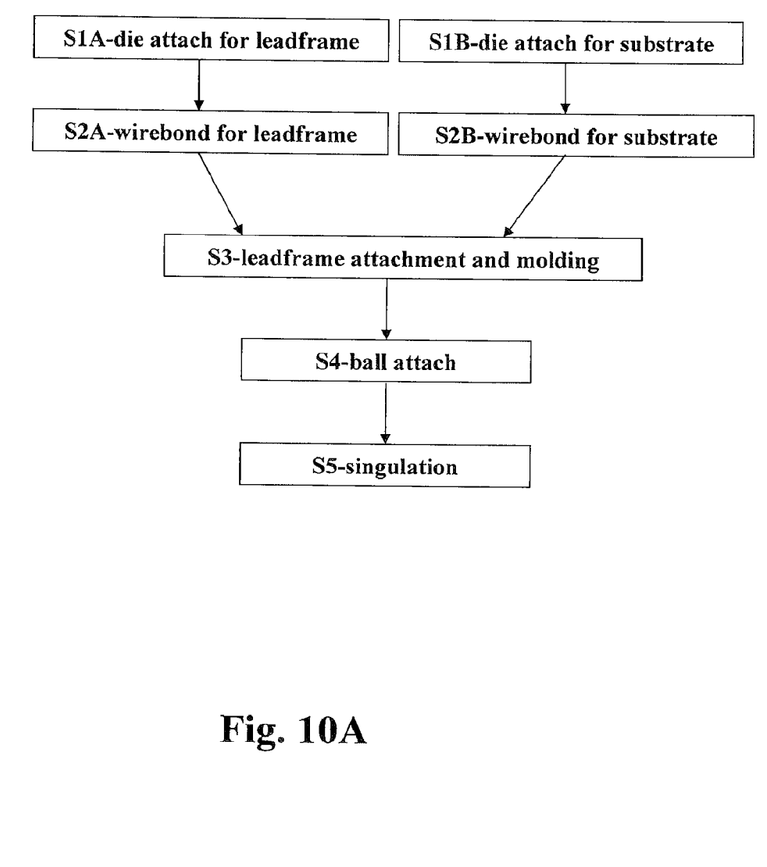
FIG. 10A shows an embodiment of a method of the invention.
Figure 10B:
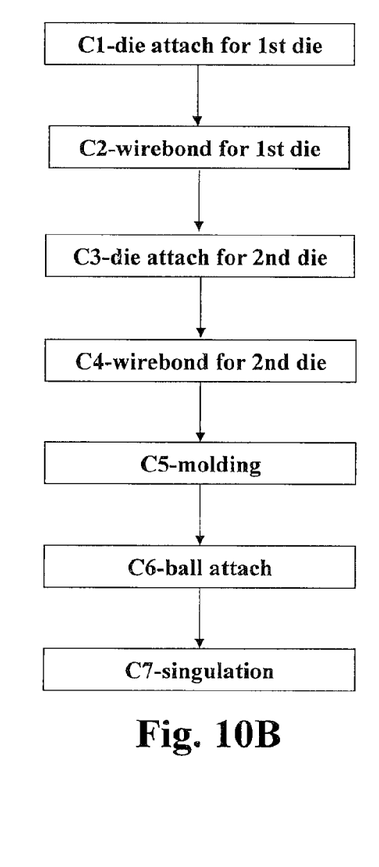
FIG. 10B shows an embodiment of a conventional method of assembling a package.

Conventional methods of forming a stacked die package can be time consuming as they require sequential implementation of the process steps involved in the package assembly. FIG. 10B shows a conventional method for assembling a semiconductor package. In step C1, a first die (i.e., an ASIC die) is attached to a substrate using a die attach epoxy. Next, in step C2, the first die is wire bonded to the substrate. Then, in step C3, a second die (i.e., a RF die) is attached to the first die using a die attach epoxy. Next, in step C4, the second die is wire bonded to the substrate. Then, in step C5, the substrate and the wire bonded dies are molded. After the molding, in step C6, solder balls are attached to the semiconductor package. In step C7, the package is singulated. The conventional method, as mentioned above, involve process steps that occur in sequential order. It will therefore be desirable to improve the process to enable some of the steps to be carried out simultaneously so that manufacturing time can be reduced.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

One semiconductor package according to an embodiment of the present invention includes a substrate with a top surface and a bottom surface, a lead frame with a top die pad surface, a bottom die pad surface and a plurality of leads, wherein the lead frame is attached to the top surface of the substrate; a first die with a top surface and a bottom surface, wherein the bottom surface is attached to the top surface of the substrate and the first die is electrically connected to the substrate; a second die with a top surface and a bottom surface, wherein the top surface is attached to the bottom die pad surface of the lead frame and the second die is electrically connected to the leadframe; and an encapsulant covering at least a portion of the lead frame and substrate.

The semiconductor package may also include a third die with a top surface and a bottom surface, wherein the bottom surface is attached to the top surface of the substrate and the third die is electrically connected to the substrate.

The semiconductor package may also include a fourth die with a top surface and a bottom surface, wherein the top surface is attached to the top bottom surface of the second die and the fourth die is electrically connected to the leadframe.

The semiconductor package may also include a third die with a top surface and a bottom surface, wherein the bottom surface is attached to the top surface of the first die and the third die is electrically connected to the substrate.

The semiconductor package may also include a fourth die with a top surface and a bottom surface, wherein the top surface is attached to the bottom surface of the second die and the fourth die is electrically connected to the leadframe.

The semiconductor package may also include a third die with a top surface and a bottom surface, wherein the top surface is attached to the bottom surface of the second die; and a plurality of bond wires connected between the bottom surface of the third die and the leads on the lead frame.

The semiconductor package may also include having the encapsulant cover the entire top die pad surface of the lead frame.

The semiconductor package may also include having the encapsulant cover the entire top die pad surface of the lead frame, except for a plurality of areas.

The semiconductor package may also include a second semiconductor package that is connected to the lead frame through the plurality of areas.

The semiconductor package may also include having the top die pad surface of the lead frame have an etched area and the encapsulant cover the etched area, but not the remaining portion of the top die pad surface.

A semiconductor package according to a second embodiment of the present invention includes a lead frame with a top die pad surface, a bottom die pad surface and a plurality of leads; a substrate with a top surface, a bottom surface, and a cavity, wherein the lead frame is attached to the top surface of the substrate; a first die with a top surface and a bottom surface, wherein the bottom surface is attached to the cavity of the substrate and the first die is electrically connected to the substrate; a second die with a top surface and a bottom surface, wherein the top surface is attached to the bottom die pad surface of the lead frame and the second die is electrically connected to the leadframe; and an encapsulant covering at least a portion of the lead frame and substrate.

The semiconductor package according to the second embodiment may also include a third die with a top surface and a bottom surface, wherein the bottom surface is attached to the cavity of the substrate and the third die is electrically connected to the substrate.

The semiconductor package according to the second embodiment may also include a fourth die with a top surface and a bottom surface, wherein the top surface is attached to the bottom surface of the second die and the fourth die is electrically connected to the leadframe.

The semiconductor package according to the second embodiment may also include a third die with a top surface and a bottom surface, wherein the bottom surface is attached to the top surface of the first die and the third die is electrically connected to the substrate.

The semiconductor package according to the second embodiment may also include a fourth die with a top surface and a bottom surface, wherein the top surface is attached to the bottom surface of the second die and the fourth die is electrically connected to the leadframe.

The semiconductor package according to the second embodiment may also include a third die with a top surface and a bottom surface, wherein the top surface is attached to the bottom surface of the second die and the third die is electrically connected to the lead frame.

The semiconductor package according to the second embodiment may also include having the encapsulant cover the entire top die pad surface of the lead frame.

The semiconductor package according to the second embodiment may also include having the encapsulant cover the entire top die pad surface of the lead frame, except for a plurality of areas.

The semiconductor package according to the second embodiment may also include a second semiconductor package that is connected to the lead frame through the plurality of areas.

The semiconductor package according to the second embodiment may also include having the top die pad surface of the lead frame include a half-etched area and the encapsulant cover the half-etched area, but not the remaining portion of the top die pad surface.

A method of manufacturing a semiconductor package according to an embodiment of the invention includes (a) providing a substrate with a top surface and a bottom surface; b) providing a lead frame with a top die pad surface, a bottom die pad surface and a plurality of leads; (c) attaching a first die with a top surface and a bottom surface to the substrate, wherein the bottom surface of the first die is attached to the top surface of the substrate and the first die is electrically connected to the substrate; (d) attaching a second die with a top surface and a bottom surface to the lead frame, wherein the top surface of the second die is attached to the bottom die pad surface of the lead frame and the second die is electrically connected to the leadframe; (e) attaching the lead frame to the top surface of the substrate; and (f) encapsulating at least a portion of the lead frame and substrate.

The method of manufacturing the semiconductor package may also include attaching solder balls to said substrate and singulating said semiconductor packages into individual semiconductor packages.

The method of manufacturing the semiconductor package may also include having steps (c) and (d) occur simultaneously.

A method of manufacturing a plurality of semiconductor packages according to a second embodiment may include (a) providing a substrate strip with a top surface and a bottom surface; (b) providing a lead frame strip with top die pad surfaces, bottom die pad surfaces and a plurality of leads; (c) attaching a plurality of first dies with top surfaces and bottom surfaces to the substrate strip, wherein the bottom surfaces of the first dies are attached to the top surface of the substrate strip and the first dies are electrically connected to the substrate strip; (d) attaching a plurality of second dies with top surfaces and bottom surfaces to the lead frame, wherein the top surfaces of the second dies are attached to the bottom die pad surfaces of the lead frame strip and the second dies are electrically connected to the leadframe strip; (e) attaching the lead frame strip to the top surface of the substrate strip; and (f) encapsulating at least a portion of the lead frame strip and substrate strip.

The second method of manufacturing the semiconductor package may also include attaching solder balls to said substrate strip and singulating said semiconductor packages into individual semiconductor packages.

The second method of manufacturing the semiconductor package may also include having steps (c) and (d) occur simultaneously.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE ILLUSTRATIVE NON-LIMITING EMBODIMENTS OF THE INVENTION

Hereinafter, the present invention will be described in detail by way of exemplary embodiments with reference to the drawings. The described exemplary embodiments are intended to assist in the understanding of the invention, and are not intended to limit the scope of the invention in any way. Throughout the drawings for explaining the exemplary embodiments, those components having identical functions carry the same reference numerals for which duplicate explanations will be omitted.

The semiconductor package of the present invention includes an inverted lead frame attached to a substrate. Each of the inverted lead frame and the substrate holds one or more dies. When the inverted leadframe is attached to the substrate, an enclosed area is formed between the inverted leadframe and the substrate and the respective one or more dies on the lead frame and on the substrate face one another. The lead frame and substrate are connected by a solder material present on the substrate or on the leads of the lead frame. The solder material can be pre-printed onto the leadframe or onto the substrate. Mold material, which encapsulates at least a portion of the lead frame and the substrate, can also hold both structures in place.

Figures 1A, 1B:
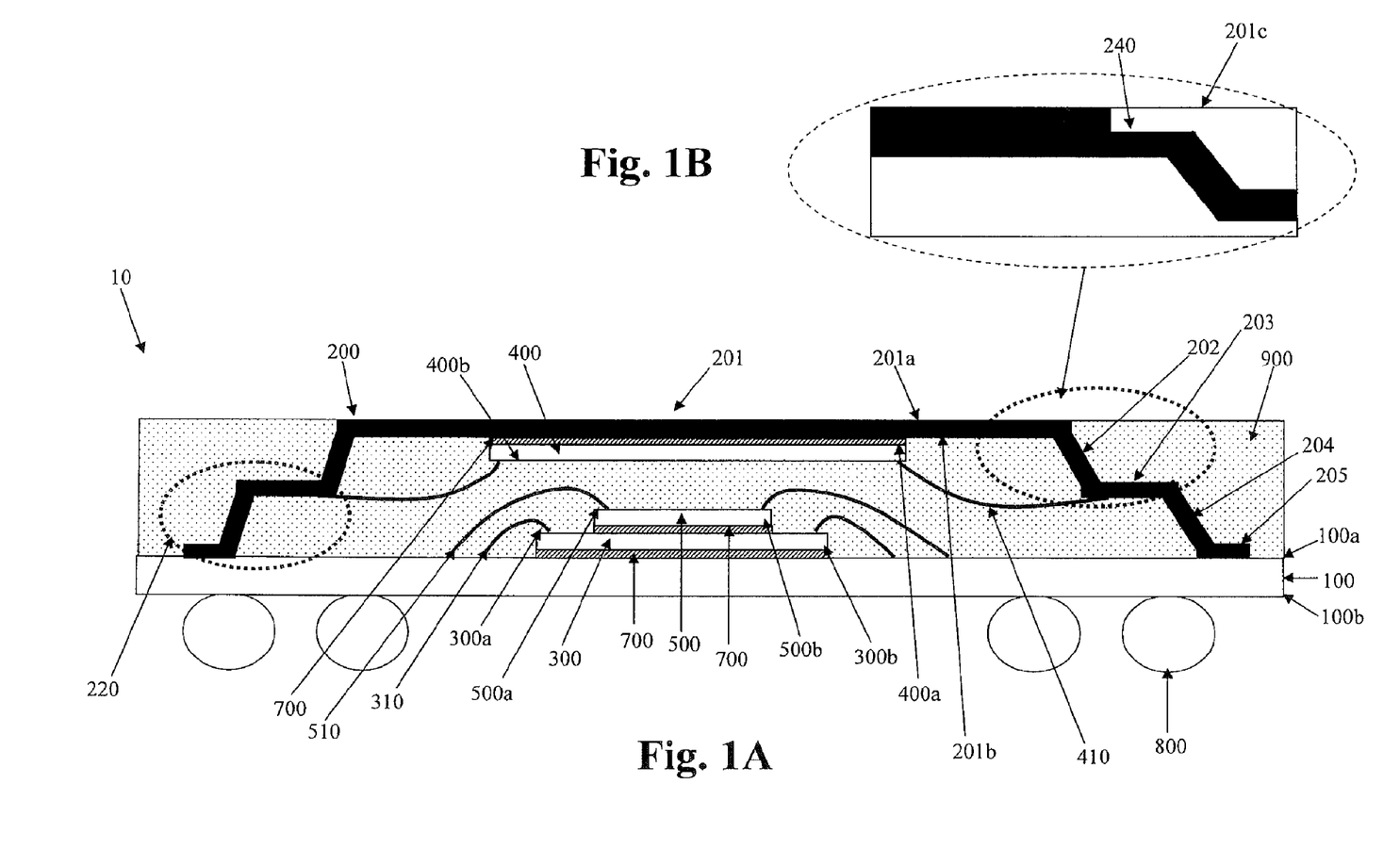
FIG. 1A shows a cross-sectional view of a first embodiment of the invention.
FIG. 1B is a cross-sectional view of a modification to the leadframe of the invention.
Figure 2A:
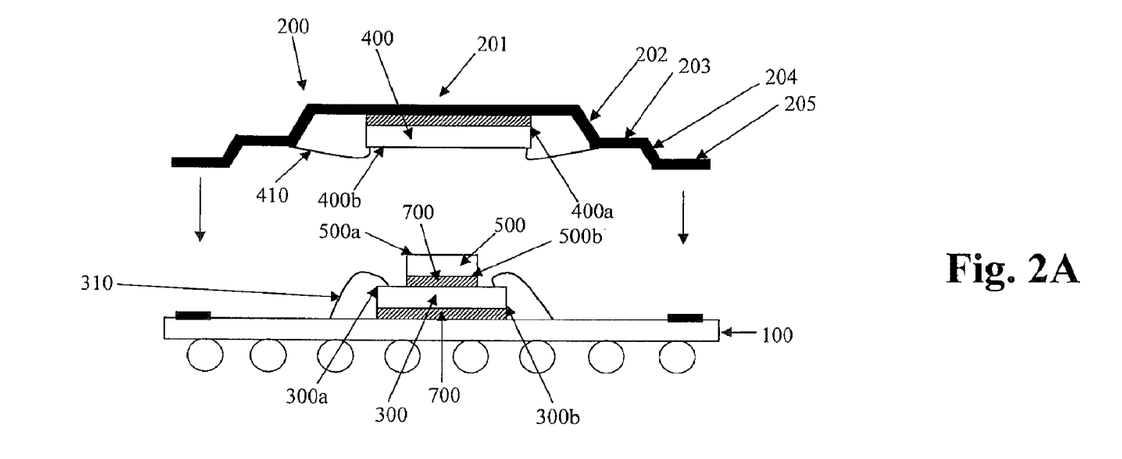
FIGS. 2A and 2B show cross-sectional and perspective views of an embodiment of a method of the invention.
Figure 2B:
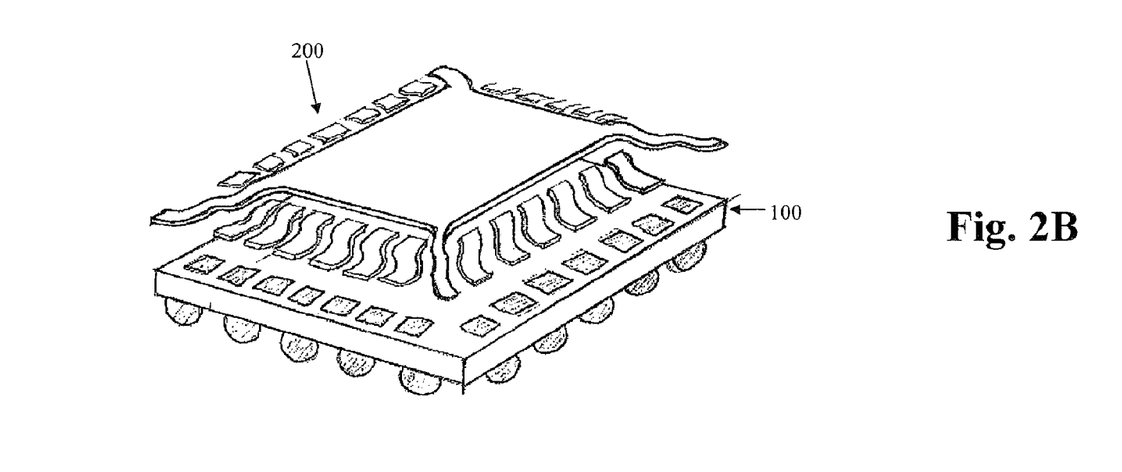

FIGS. 1A, 2A and 2B show an example of one embodiment of the semiconductor package 10 of the invention. The package includes a substrate 100 with a top surface 100a and a bottom surface 100b; a lead frame 200 with a die pad portion 201 and a plurality of leads 220; a first semiconductor die 300 with a top surface 300a and a bottom surface 300b, wherein the bottom surface 300b is attached to the top surface 100a of the substrate 100; and a second semiconductor die 400 with a top surface 400a and a bottom surface 400b, wherein the top surface 400a is attached to a bottom die pad surface 201b of the lead frame 200. The package 10 may also include a third semiconductor die 500 with a top surface 500a and a bottom surface 500b, wherein the bottom surface 500b is attached to the top surface 300a of the first semiconductor die 300. The leadframe 200 has a die pad portion 201, first sloped portions 202, intermediate portions 203, second sloped portions 204 and bottom portions 205. The first sloped portion 202 adjoins the die pad portion 201 to the intermediate portion 203, and the second sloped portion 204 adjoins the intermediate portion 203 to the bottom portion 205 to form a double down set frame as shown in FIGS. 1A, 2A and 2B. The die pad portion 201 has a top die pad surface 201a and a bottom die pad surface 201b. The intermediate portions 203, second sloped portions 204 and bottom portions 205 form the leads of the leadframe 200. It will be appreciated that while the leadframe as described in this embodiment, has a double down set frame, a lead frame with more than two down sets may also be used.

The first semiconductor die 300 is attached via an adhesive 700 to the substrate 100 with its bottom surface 300b facing the top surface 100a of the substrate 100. The first semiconductor die 300 is electrically connected to the substrate 100 by way of wire bonds 310 extending from the top surface 300a of the first semiconductor die 300 to the top surface 100a of the substrate 100. The second semiconductor die 400 is attached via an adhesive 700 to the bottom die pad surface 201a of the leadframe 200. The second semiconductor die 400 is electrically connected to the intermediate portion 203 of the leadframe 200 by way of wire bonds 410 extending from the bottom surface 400b of the second semiconductor die 400 to the intermediate portion 203 of the lead frame 200. A third semiconductor die 500 is attached via an adhesive 700 to the top surface 300a of the first semiconductor die 300. Wire bonds 510 electrically connect the third semiconductor die 500 to the substrate 100. Solder balls 800 are attached to the bottom surface 100b of the substrate 100. The leadframe 200, except for the top die pad surface 201a which is exposed to the outside, are encapsulated with molding compound 900. Because the top die pad surface 201a of the leadframe 200 is exposed to the outside, it enhances heat dissipation. It will be appreciated that while wire bonding are described in this embodiment as a means for forming electrical connections between the dies and their respective substrate or leadframe, other forms of electrical connections such as a flip chip connection as described for example in FIG. 5, may also be possible.

In this particular embodiment, the largest of the three semiconductor dies 400 is attached to the leadframe 200. Because the two smaller semiconductor dies 300, 500 are attached to the substrate 100 instead of the leadframe, the bond wires associated with the smaller semiconductor dies 300, 500 can be shorter as compared to if the three dies 300, 400, 500 are stacked vertically in conventional semiconductor packages.

FIG. 1B is an enlargement of an alternate embodiment of corner portions 201c of the leadframe 200. In the embodiment in FIG. 1B, a notch 240 is etched, for example, half-etched, in the corner portions 201c of the leadframe 200. The notch 240 can improve engagement of the mold material 900 to the leadframe 200 and can therefore better secure the lead frame 200 to the substrate 100. It will be appreciated that while the notch 240 is described in this alternate embodiment as being etched at the corner portions 201c, the notch 240 may be formed on any other portions of the lead frame 200 to promote engagement of the mold compound 900 thereto.

Figure 4:
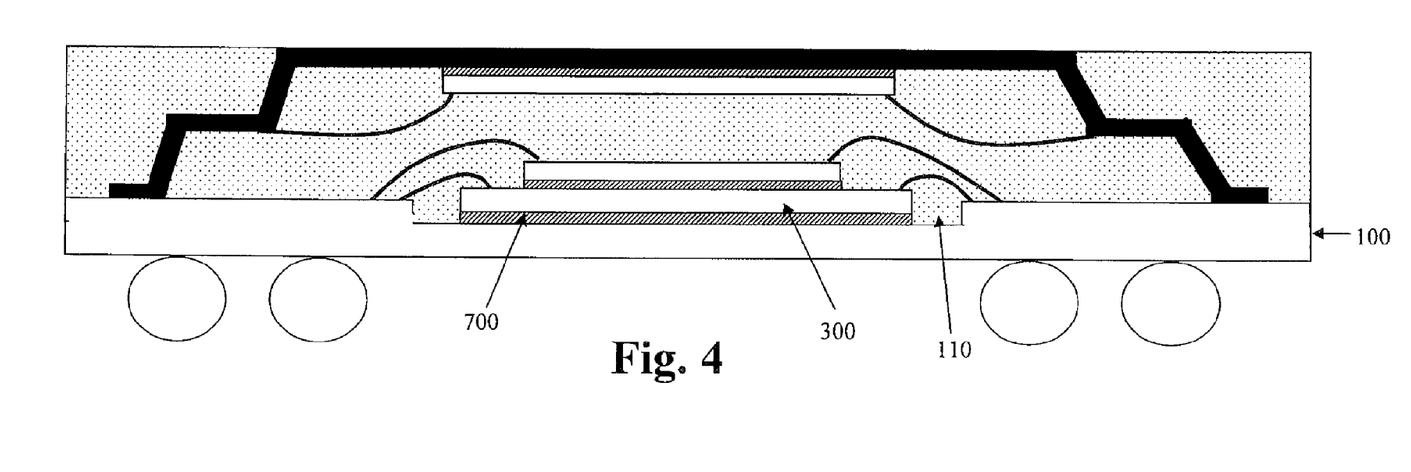
FIG. 4 shows a cross-sectional view of a second embodiment of the invention.

FIG. 4 shows an example of a second embodiment of the semiconductor package 10 of the invention. Like-numbered elements are the same as those in the previous figures. In this embodiment, the substrate 100 has a cavity 110. Another difference is that the first semiconductor die 300 is attached to the bottom of the substrate cavity 110 via an adhesive 700.

Figure 5:
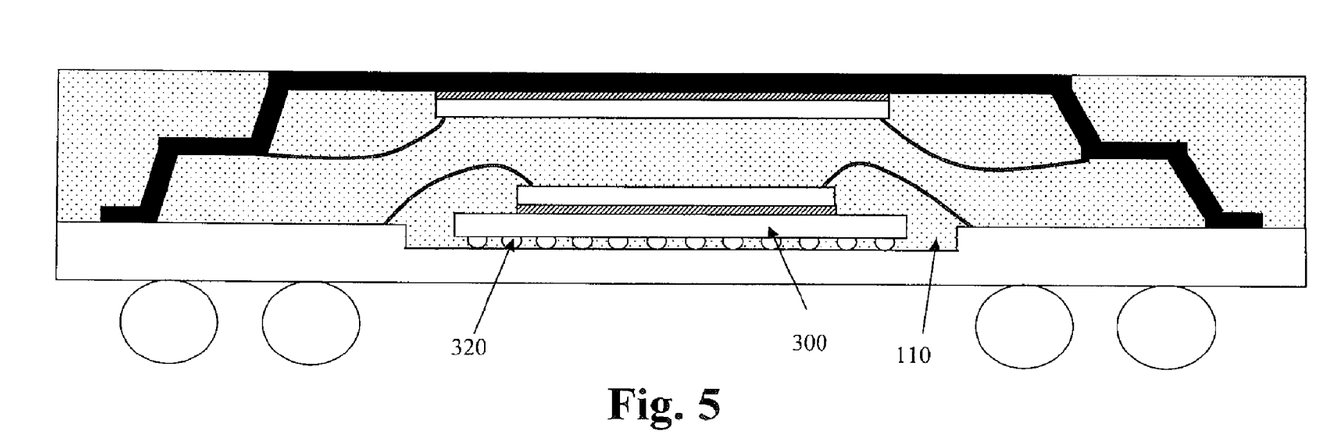
FIG. 5 shows a cross-sectional view of a third embodiment of the invention.

FIG. 5 shows an example of a third embodiment of the semiconductor package 10 of the invention. Like-numbered elements are the same as those in the previous figures. Like the second embodiment, this embodiment also has a cavity 110 in the substrate 100. Another difference is that the first semiconductor die 300 is attached to the bottom of the substrate cavity 110 via solder bumps 320.

Figure 6:
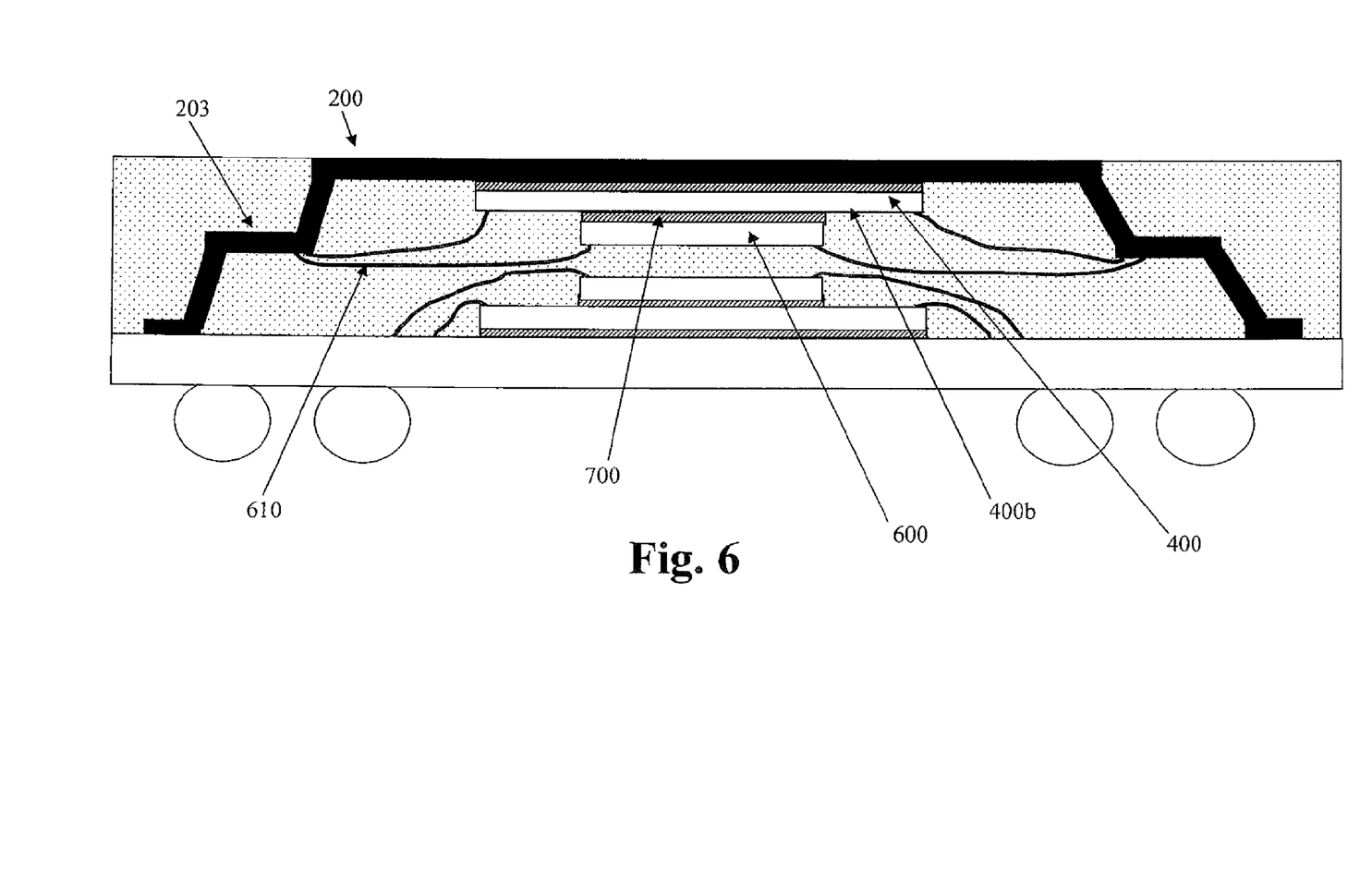
FIG. 6 shows a cross-sectional view of a fourth embodiment of the invention.

FIG. 6 shows an example of a fourth embodiment of the semiconductor package 10 of the invention. Like-numbered elements are the same as those in the previous figures. This embodiment is similar to the first embodiment except that it has an additional semiconductor die 600 attached via an adhesive 700 to the bottom surface 400b of the second semiconductor die 400. In addition, there are wire bonds 610 that electrically connect the fourth semiconductor die 600 to the intermediate portion 203 of the leadframe 200.

Figure 7:
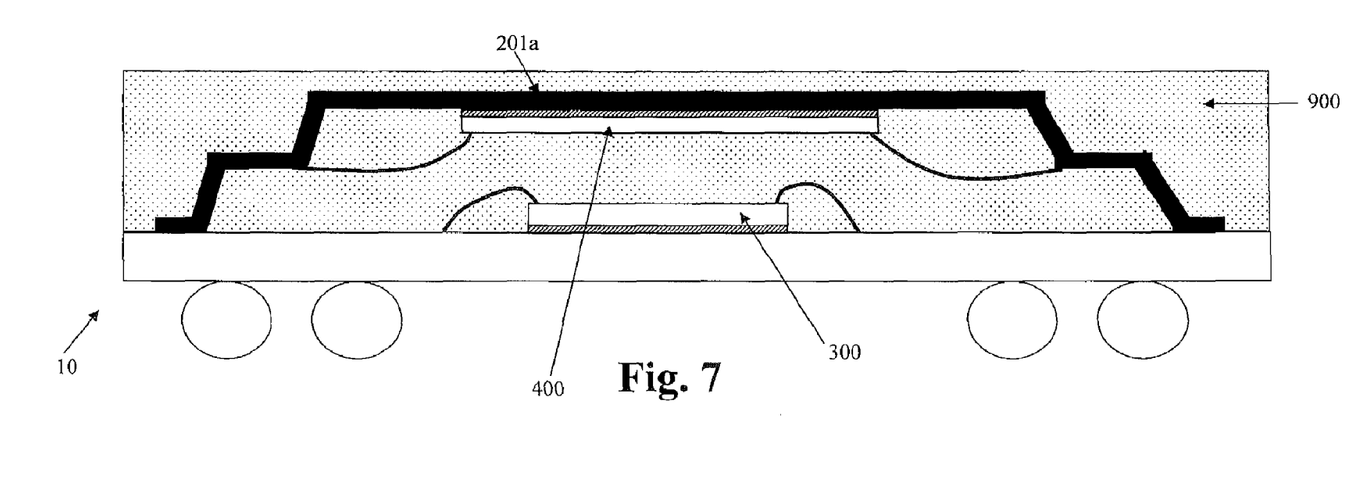
FIG. 7 shows a cross-sectional view of a fifth embodiment of the invention.

FIG. 7 shows an example of a fifth embodiment of the semiconductor package 10 of the invention. Like-numbered elements are the same as those in the previous figures. This embodiment is similar to the first embodiment except that only the first and second semiconductor dies 300 and 400 are shown. Additional semiconductor dies could be part of the semiconductor package 10. In addition, the top die pad surface 201a of the leadframe 200 is not exposed to the outside; rather the molding compound 900 completely covers the entire leadframe 200.

Figure 8:
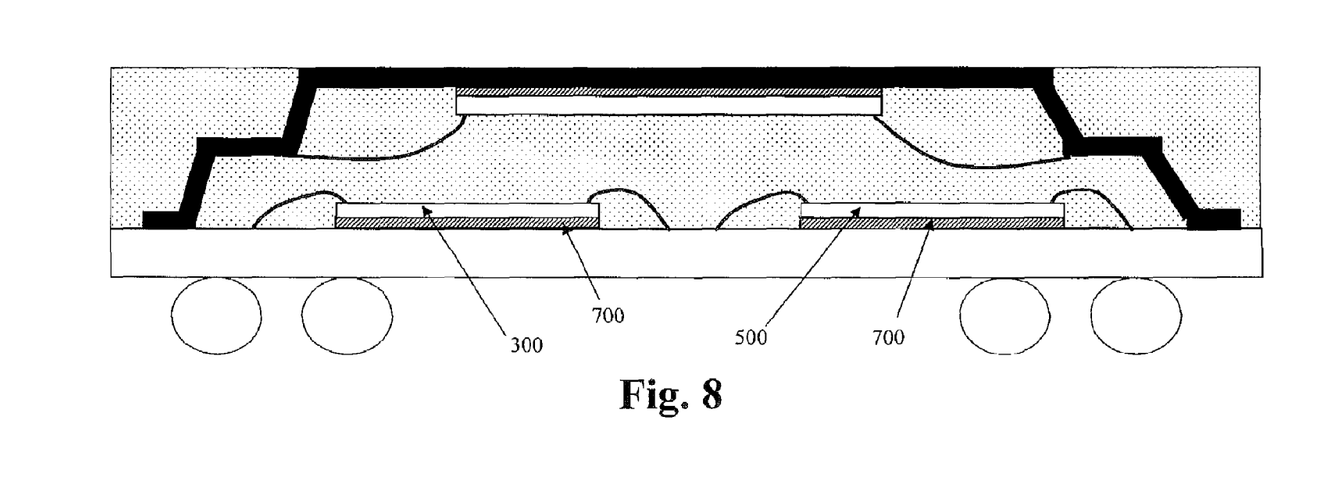
FIG. 8 shows a cross-sectional view of a sixth embodiment of the invention.

FIG. 8 shows an example of a sixth embodiment of the semiconductor package 10 of the invention. Like-numbered elements are the same as those in the previous figures. This embodiment is also similar to the first embodiment except that the third semiconductor die 500 is connected via an adhesive 700 to the substrate 100 instead of the top surface 300a of the first semiconductor die 300.

Figure 9A:
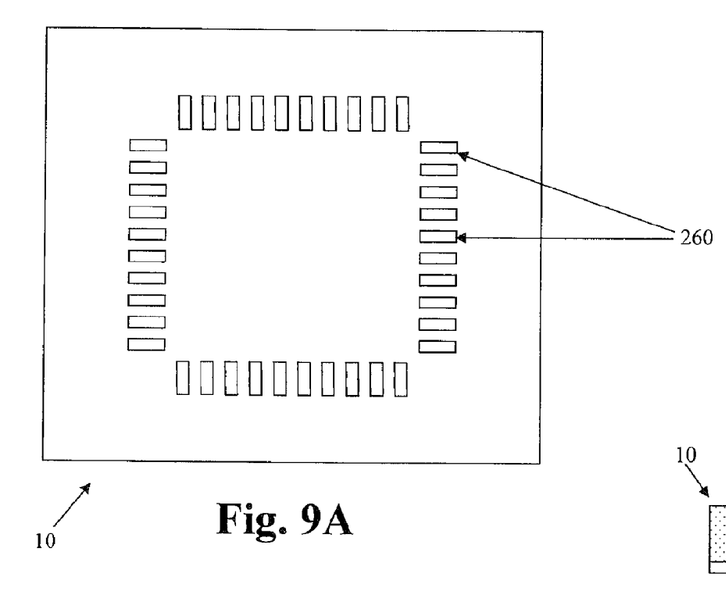
FIGS. 9A, 9B and 9C show top and cross-sectional views of a seventh embodiment of the invention.
Figure 9B:
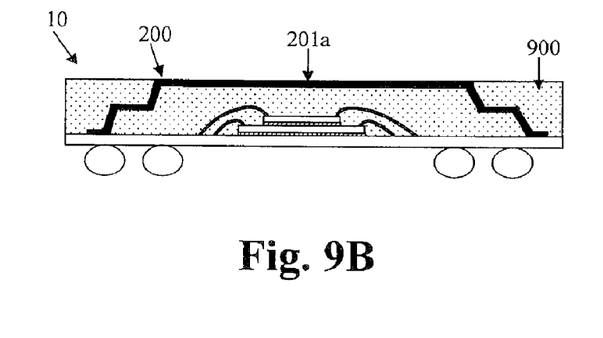
Figure 9C:
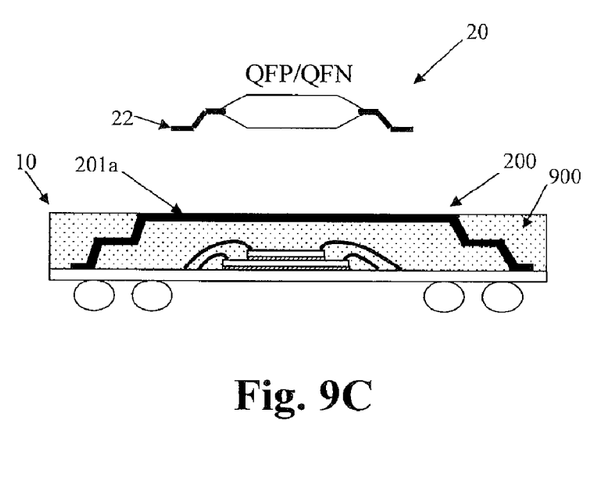

FIGS. 9A, 9B and 9C show an example of a seventh embodiment of the semiconductor package 10 of the invention. Like-numbered elements are the same as those in the previous figures. In this embodiment, the molding compound 900 encapsulates the entire top die pad surface 201a of the leadframe 200, except for a plurality of areas 260 shown in the top view of FIG. 9A. The areas 260 expose a plurality of leads. As shown in FIG. 9C, a quad flat package (QFP) 20 can be attached via leads 22 to the exposed plurality of leads 260. Likewise a quad flat no leads package (QFN) (not shown) may be attached via solder connections to the exposed plurality of leads 260.

Next, a method of assembling the inventive semiconductor package will be described in connection with FIG. 10A.

In step S1A, the second semiconductor die 400 is attached to the bottom die pad surface 201b of the lead frame 200, and at the same time in step S1B, the first semiconductor die 300 is attached to the top surface 100a of the substrate 100. Next, in step S2A, the second die 400 is wire bonded to the lead frame 200, and at the same time in step S2B, the first die 300 is wire bonded to the substrate 100. Then, in step S3, the leadframe 200 is inverted and attached to the substrate 100 at the bottom portion 205 using solder material, and thereafter the leadframe 200 and the substrate 100 are placed in a mold where mold material 900 encapsulates at least a portion of the substrate 100 and the leadframe 200. After the molding, in step S4, solder balls 800 are attached to the bottom surface 100b of the substrate 100. In step S5, the package is singulated.

Because the two die attach steps (S1A and S1B) and the two wire bonding steps (S2A and S2B) for the semiconductor dies have been combined, the assembly time decreases and the units per hour (UPH) rate increases.

Figure 3A:
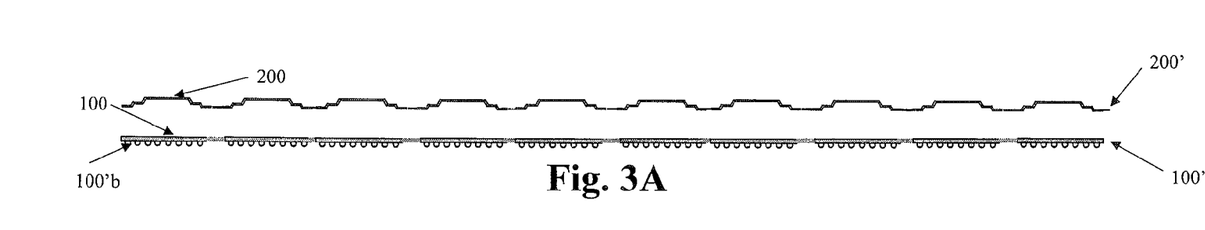
FIGS. 3A, 3B and 3C show cross-sectional and top views of an embodiment of the leadframe and substrate of the invention.

The assembly method can also be performed for a plurality of semiconductor packages. See for example, FIGS. 3A, 3B and 3C. FIG. 3A shows a cross-sectional view of a leadframe strip 200' that includes a plurality of leadframes 200. FIG. 3A also shows a cross-sectional view of a substrate strip 100' that includes a plurality of substrates 100 with external solder ball connections 800 formed at a bottom surface 100'b.

Figure 3B:
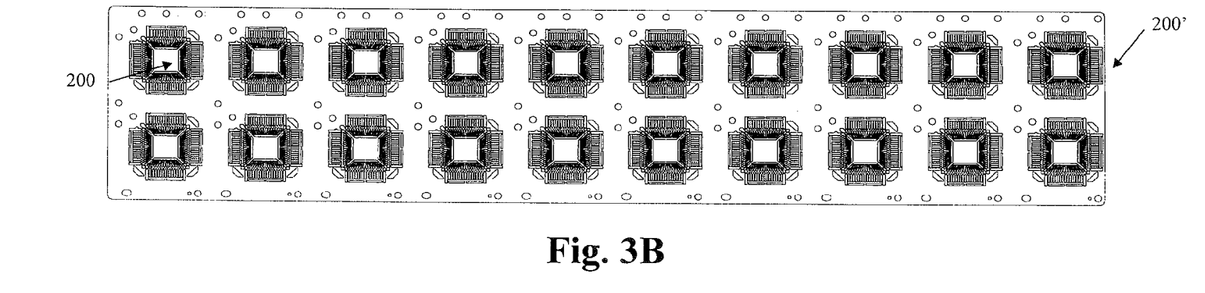
Figure 3C:
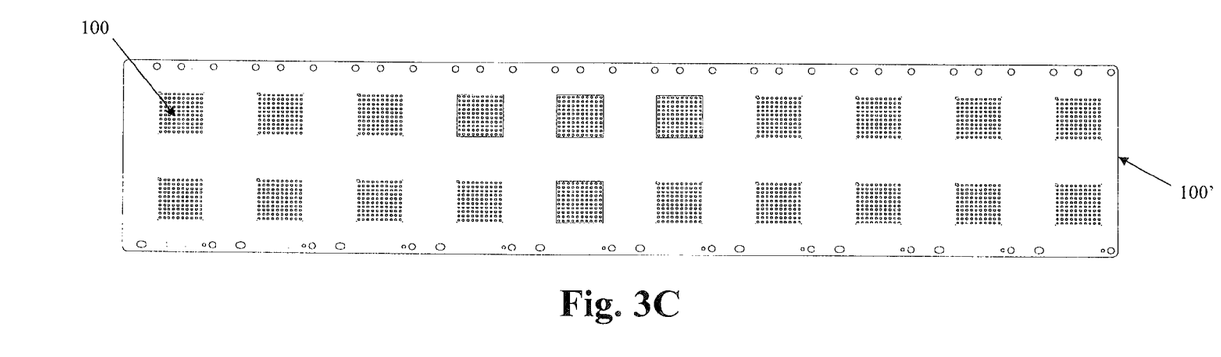

FIG. 3B shows a top view of the leadframe strip 200' which shows a matrix of leadframes 200. FIG. 3C shows a top view of the substrate strip 100' which shows a matrix of substrates 100.

During the manufacturing process, a plurality of semiconductor dies can be attached to both the leadframe strip 200' and to the substrate strip 100' at the same time. Next, the wire bonding step is performed for all of the semiconductor dies. Then the leadframe strip 200' and substrate strip 100' are attached to each other and placed in a mold where the leadframe strip 200' and the substrate strip 100' are encapsulated. After encapsulation, individual semiconductor packages 10 are created by singulation.

Assembling semiconductor packages in a strip form can increase both the units per hour rate and accuracy.

The invention offers several advantages over the convention packages and methods. For example, when bundling a smaller die with conductor/resistance limitations and a larger die in a semiconductor package, wire bonds for the smaller die in the semiconductor package of the present invention are kept as short as possible while the smaller die is attached to the substrate. In the conventional semiconductor package, the top smaller die will have a longer wire bond.

In the present invention, when stacking more than two dies, a "pyramid" stacking of dies on the lead frame and on the substrate can be maintained while keeping the wire bonds for the smaller dies with conductor/resistance limitations as short as possible. This can be achieved by stacking the smaller dies with conductor/resistance limitations in a pyramidal structure on the substrate and stacking the larger dies in the same manner on the leadframe. In the conventional method of die stacking, to maintain the shortest possible wire bond for the smaller dies, the dies would need to be stacked in an inverted pyramid manner on the substrate. As will be understood by persons skilled in the art, an "inverted pyramid" manner of stacking of dies would require further processing steps so that the larger top die does not sit on the bond pads of the smaller bottom die. The further processing steps may include using spacers or interposers between the dies which may result in potential package reliability issues.

As mentioned above, when the top die pad surface of the leadframe is exposed to the outside, the leadframe can act as a heat spreader that can provide increased thermal performance in both theta Ja (junction to ambient) and theta Jc (junction to case). The lead frame can also act as a shielding (i.e., electromagnetic interference shielding) when the package is assembled onto a printed circuit board (PCB).

Finally, while the various embodiments show only two dies stacked together, more dies could be added to package while maintaining the height of the package through the use of the inverted lead frame and substrate. Package thinness may further be improved by coupling the inverted lead frame to a cavity in the substrate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
a substrate with a top surface and a bottom surface;
a lead frame with a top die pad surface, a bottom die pad surface and a plurality of leads, wherein the lead frame is attached to the top surface of the substrate;
a first die with a top surface and a bottom surface, wherein the bottom surface is attached to the top surface of the substrate and the first die is electrically connected to the substrate;
a second die with a top surface and a bottom surface, wherein the top surface is attached to the bottom die pad surface of the lead frame and the second die is electrically connected to the leadframe; and
an encapsulant covering at least a portion of the lead frame and substrate.

2. The package of claim 1, further comprising:
a third die with a top surface and a bottom surface, wherein the bottom surface is attached to the top surface of the substrate and the third die is electrically connected to the substrate.

3. The package of claim 2, further comprising:
a fourth die with a top surface and a bottom surface, wherein the top surface is attached to the top bottom surface of the second die and the fourth die is electrically connected to the leadframe.

4. The package of claim 1, further comprising:
a third die with a top surface and a bottom surface, wherein the bottom surface is attached to the top surface of the first die and the third die is electrically connected to the substrate.

5. The package of claim 4, further comprising:
a fourth die with a top surface and a bottom surface, wherein the top surface is attached to the bottom surface of the second die and the fourth die is electrically connected to the leadframe.

6. The package of claim 1, further comprising:
a third die with a top surface and a bottom surface, wherein the top surface is attached to the bottom surface of the second die; and
a plurality of bond wires connected between the bottom surface of the third die and the leads on the lead frame.

7. The package of claim 1, wherein the encapsulant covers the entire top die pad surface of the lead frame.

8. The package of claim 1, wherein the encapsulant covers the entire top die pad surface of the lead frame, except for a plurality of areas.

9. The package of claim 8, further comprising a second semiconductor package that is connected to the lead frame through the plurality of areas.

10. The package of claim 1, wherein the top die pad surface of the lead frame comprises an etched area and wherein the encapsulant covers the etched area, but not remaining portion of the top die pad surface.

11. A semiconductor package comprising:
a lead frame with a top die pad surface, a bottom die pad surface and a plurality of leads;
a substrate with a top surface, a bottom surface, and a cavity, wherein the lead frame is attached to the top surface of the substrate;
a first die with a top surface and a bottom surface, wherein the bottom surface is attached to the cavity of the substrate and the first die is electrically connected to the substrate;
a second die with a top surface and a bottom surface, wherein the top surface is attached to the bottom die pad surface of the lead frame and the second die is electrically connected to the leadframe; and
an encapsulant covering at least a portion of the lead frame and substrate.

12. The package of claim 11, further comprising:
a third die with a top surface and a bottom surface, wherein the bottom surface is attached to the cavity of the substrate and the third die is electrically connected to the substrate.

13. The package of claim 12, further comprising:
a fourth die with a top surface and a bottom surface, wherein the top surface is attached to the bottom surface of the second die and the fourth die is electrically connected to the leadframe.

14. The package of claim 11, further comprising:
a third die with a top surface and a bottom surface, wherein the bottom surface is attached to the top surface of the first die and the third die is electrically connected to the substrate.

15. The package of claim 14, further comprising:
a fourth die with a top surface and a bottom surface, wherein the top surface is attached to the bottom surface of the second die and the fourth die is electrically connected to the leadframe.

16. The package of claim 11, further comprising:
a third die with a top surface and a bottom surface, wherein the top surface is attached to the bottom surface of the second die and the third die is electrically connected to the lead frame.

17. The package of claim 11, wherein the encapsulant covers the entire top die pad surface of the lead frame.

18. The package of claim 11, wherein the encapsulant covers the entire top die pad surface of the lead frame, except for a plurality of areas.

19. The package of claim 18, further comprising a second semiconductor package that is connected to the lead frame through the plurality of areas.

20. The package of claim 11, wherein the top die pad surface of the lead frame comprises a half-etched area and wherein the encapsulant covers half-etched area, but not remaining portion of the top die pad surface.

21. A method of manufacturing a semiconductor package comprising:
(a) providing a substrate with a top surface and a bottom surface;
(b) providing a lead frame with a top die pad surface, a bottom die pad surface and a plurality of leads;
(c) attaching a first die with a top surface and a bottom surface to the substrate, wherein the bottom surface of the first die is attached to the top surface of the substrate and the first die is electrically connected to the substrate;
(d) attaching a second die with a top surface and a bottom surface to the lead frame, wherein the top surface of the second die is attached to the bottom die pad surface of the lead frame and the second die is electrically connected to the leadframe;
(e) attaching the lead frame to the top surface of the substrate; and
(f) encapsulating at least a portion of the lead frame and substrate.

22. The method of claim 21, further comprising:
attaching solder balls to said substrate and
singulating said semiconductor packages into individual semiconductor packages.

23. The method of claim 21, wherein steps (c) and (d) occur simultaneously.

24. A method of manufacturing a plurality of semiconductor packages comprising:
(a) providing a substrate strip with a top surface and a bottom surface,
(b) providing a lead frame strip with top die pad surfaces, bottom die pad surfaces and a plurality of leads;
(c) attaching a plurality of first dies with top surfaces and bottom surfaces to the substrate strip, wherein the bottom surfaces of the first dies are attached to the top surface of the substrate strip and the first dies are electrically connected to the substrate strip;
(d) attaching a plurality of second dies with top surfaces and bottom surfaces to the lead frame, wherein the top surfaces of the second dies are attached to the bottom die pad surfaces of the lead frame strip and the second dies are electrically connected to the leadframe strip;
(e) attaching the lead frame strip to the top surface of the substrate strip; and
(f) encapsulating at least a portion of the lead frame strip and substrate strip.

25. The method of claim 24, further comprising:
attaching solder balls to said substrate strip and
singulating said semiconductor packages into individual semiconductor packages.

26. The method of claim 24, wherein steps (c) and (d) occur simultaneously.

* * * * *